(12) United States Patent
Vreede et al.

(10) Patent No.: US 7,676,342 B2
(45) Date of Patent: Mar. 9, 2010

(54) SENSOR ASSEMBLY, DIGITAL SERIAL BUS AND PROTOCOL, SENSOR NETWORK, AND LITHOGRAPHIC APPARATUS AND SYSTEM

(75) Inventors: Olaf Theo Jos Vreede, Best (NL); Adrianus Johannes Palm, Eindhoven (NL); Ronald Gijsbertse, Riethoven (NL); Fransiscus Antonius Josephus Tillie, Boxtel (NL)

(73) Assignee: ASML Netherlands B.V., Veldhoven (NL)

( * ) Notice: Subject to any disclaimer, the term of this patent is extended or adjusted under 35 U.S.C. 154(b) by 885 days.

(21) Appl. No.: 11/019,523

(22) Filed: Dec. 23, 2004

(65) Prior Publication Data
US 2006/0138307 A1 Jun. 29, 2006

(51) Int. Cl.
*G01D 1/00* (2006.01)
*C12Q 1/68* (2006.01)

(52) U.S. Cl. ........................... 702/127; 250/200

(58) Field of Classification Search ................. 702/127, 702/182–183, 188, 81, 84; 257/E21.528; 438/14, 16; 370/464; 700/108; 250/491.1, 250/492.2, 492.21–492.24, 492.3, 200, 203.2, 250/214 R, 548
See application file for complete search history.

(56) References Cited

U.S. PATENT DOCUMENTS

| | | | | |
|---|---|---|---|---|
| 4,296,464 A * | 10/1981 | Woods et al. | ............... | 710/308 |
| 5,335,186 A * | 8/1994 | Tarrant | ........................ | 702/127 |
| 5,375,073 A * | 12/1994 | McBean | ........................ | 702/91 |
| 5,444,637 A * | 8/1995 | Smesny et al. | ............... | 702/127 |
| 5,790,432 A * | 8/1998 | Morys | ........................ | 702/91 |
| 6,002,996 A * | 12/1999 | Burks et al. | .................. | 702/188 |
| 6,182,510 B1 * | 2/2001 | Stanke et al. | .................. | 73/597 |
| 6,646,275 B2 * | 11/2003 | Oae et al. | ................. | 250/492.2 |
| 6,652,710 B2 * | 11/2003 | Cruse | .................... | 156/345.48 |
| 6,691,068 B1 * | 2/2004 | Freed et al. | .................. | 702/187 |
| 6,708,239 B1 * | 3/2004 | Ellerbrock et al. | ............ | 710/62 |
| 6,892,156 B2 * | 5/2005 | Ye et al. | ...................... | 702/117 |
| 7,058,737 B2 * | 6/2006 | Ellerbrock et al. | ............ | 710/61 |

FOREIGN PATENT DOCUMENTS

| | | |
|---|---|---|
| JP | 2000-510077 A | 8/2000 |
| JP | 2000-349015 A | 12/2000 |
| JP | 2003-108223 A | 4/2003 |

OTHER PUBLICATIONS

Tan et al., An In-Situ Temperature Measurement System for DUV Lithography, Aug. 2003, IEEE Transactions on Instrumentation and Measurement, vol. 52, No. 4, pp. 1136-1142.*

* cited by examiner

*Primary Examiner*—Michael P. Nghiem
*Assistant Examiner*—Toan M Le
(74) *Attorney, Agent, or Firm*—Pillsbury Winthrop Shaw Pittman LLP (57) ABSTRACT

An sensor assembly according to one embodiment includes a sensor, an analog-to-digital converter configured to digitize a data signal received from the sensor, and an array of logic elements configured to receive a first data transmission over a serial bus and to transmit a second data transmission including information in the digitized signal over the serial bus. The array of logic elements is configured to transmit the second data transmission according to information received in the first data transmission.

31 Claims, 9 Drawing Sheets

| MNEMONIC | BIT | VALUE | DESCRIPTION |
|---|---|---|---|
| ST | 0 | 0 | Start Bit |
| DATA | 1-8 | - | 8 bits (1 byte) of data, least-significant bit (LSB) first. |
| AD | 9 | 0<br>1 | Address bit:<br>data packet<br>address packet |
| PA | 10 | - | Parity of packet, calculated on number of 1's in DATA, AD, and PA bits (odd parity). |
| SP | 11 | 1 | Stop bit, indicates end of data packet |

SENSOR ASSEMBLY, DIGITAL SERIAL BUS AND PROTOCOL, SENSOR NETWORK, AND LITHOGRAPHIC APPARATUS AND SYSTEM

BACKGROUND

1. Field of the Invention

This invention relates to a system and method of transmitting data in a lithographic device.

2. Background Information

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate.

In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

A lithographic apparatus may include several sensors to monitor conditions within the apparatus such as local temperature and received light. The sensors are typically coupled to an electronic rack outside the apparatus, wherein the rack may include one or more cards inserted into one or more backplanes. Lithographic devices typically use an analog signal path to couple the sensors to the electronic rack.

As extreme ultraviolet (EUV) lithography develops, problems arise that are related to the vacuum environment in which EUV exposure is performed. In a vacuum, cables give rise to outgassing, which may cause contamination of the vacuum, potentially leading to problems such as fouling of optical elements. Another problem associated with the operation of electronics in a vacuum is the lack of an atmosphere to support conductive heat transfer, which may complicate the use of heat-generating circuit elements.

In a sensor bus, reliability and support for real-time operation may also be desired.

SUMMARY

A sensor assembly according to one embodiment includes a sensor configured to output sensor data; an analog-to-digital converter configured to receive an analog signal corresponding to the sensor data and to output a digital signal of the sensor data. The sensor assembly further includes a local processor configured to receive a first data transmission over a digital serial bus from a remote processor and to transmit a second data transmission over the digital serial bus. The local processor may be configured to transmit the second data transmission based on information received in the first data transmission.

A method of providing data to a remote processor according to another embodiment includes receiving information over a serial data line from the remote processor; generating an analog signal corresponding to a condition sensed at a measurement site; at a location local to the measurement site, obtaining a digital signal based on the analog signal; at the location local to the measurement site, outputting a serial data stream based on the digital signal over a serial data line; and transporting information over the serial data line. At least one among the generating the analog signal, obtaining the digital signal, and outputting the serial data stream is performed in accordance with the pretrigger information received over the serial data line.

A method of data acquisition according to a further embodiment includes transmitting digital control information to a sensor assembly in a vacuum area over a serial data bus, the digital control information including an address of the sensor unit. The method also includes, in accordance with the control information, receiving a serial data stream over the serial data bus, the serial data stream including digital sensor data from the sensor assembly.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments of the invention may be applied to provide a digital bus for light sensors in lithography machines.

Figure 1:
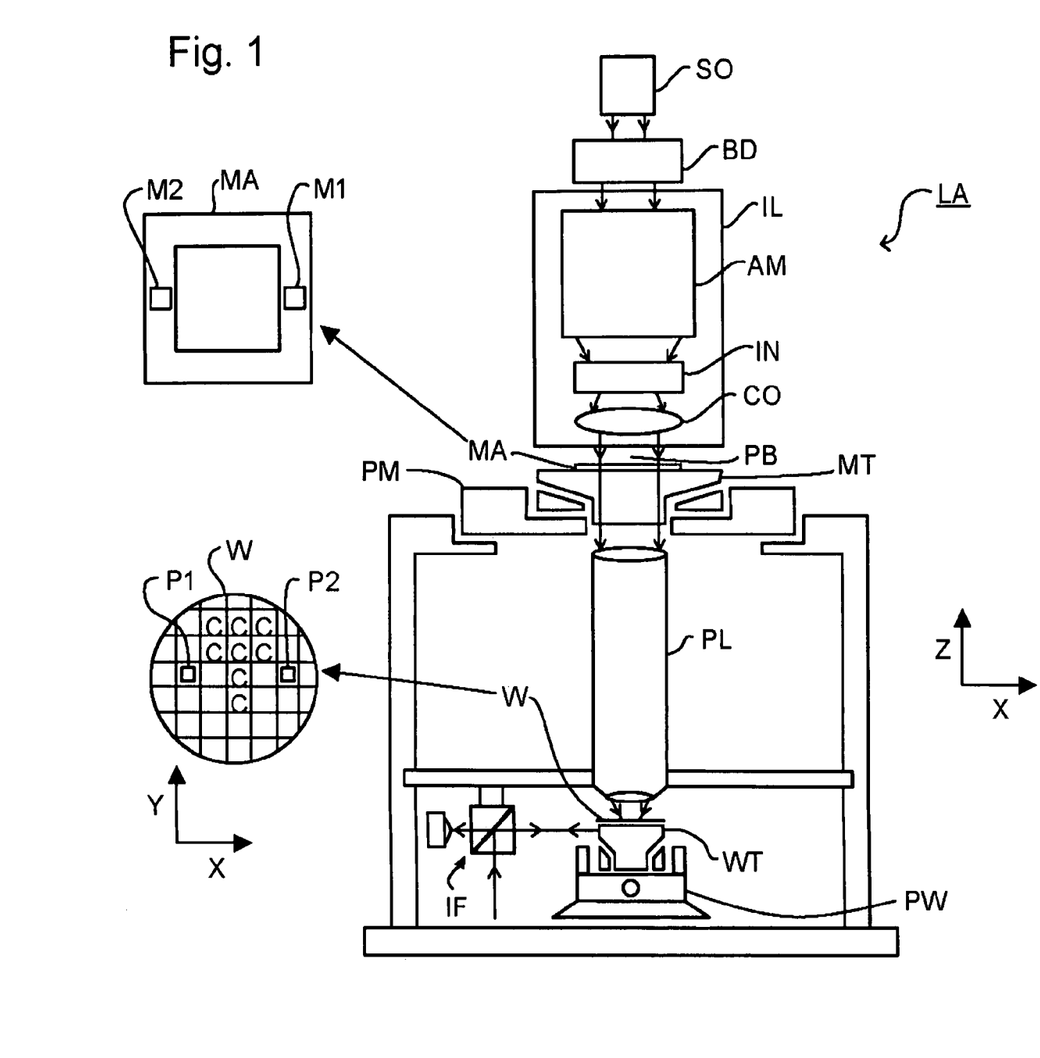
FIG. 1 illustrates a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation, EUV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example, when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In one embodiment of the invention, a lithographic apparatus may include several sensors to monitor conditions such as local temperature and received light, among other conditions. In one example, an energy sensor may be used to indicate the energy of the illumination beam. Such a sensor may be implemented with a photodiode positioned behind a mirror in the beam path (e.g. at a position between the radiation source and the reticle). The mirror, which may be made of aluminum and may be a reflecting surface of a prism, is typically designed to transmit only a small portion (e.g. one percent) of the beam energy to the sensor. A lens and filter may also be placed in the path between the mirror and the energy sensor. In one implementation, the temperature of the energy sensor may be kept constant using a Peltier element and a temperature sensor.

A spot sensor may be used to measure light intensity of the illumination field at the wafer stage level. Measurements obtained by the spot sensor (which may also be implemented using a photodiode) may be used for dose control.

A quadcell may be used to measure alignment of the reticle, light source and/or wafer. For reticle prealignment, one or more quadcells may be mounted in the reticle table and illuminated (e.g. by LEDs) to determine alignment of the reticle relative to the table. For relative alignment of a reticle and wafer, an image of a wafer mark may be projected onto a reticle mark while at least one of the reticle and wafer is moved relative to the other, with the resulting light outgoing from the reticle mark being sensed by a quadcell.

In one implementation, a quadcell may contain four photosensitive elements (e.g. photodiodes or photocells). Typically, one electrode of each element may be in common. Each quadrant of the quadcell may produce a current proportional to the intensity of the illumination falling upon it. A transconductance amplifier may be used to convert the current into a voltage, and a filter may be used to remove noise (e.g. from mechanical resonances) from the signal.

Figure 2:
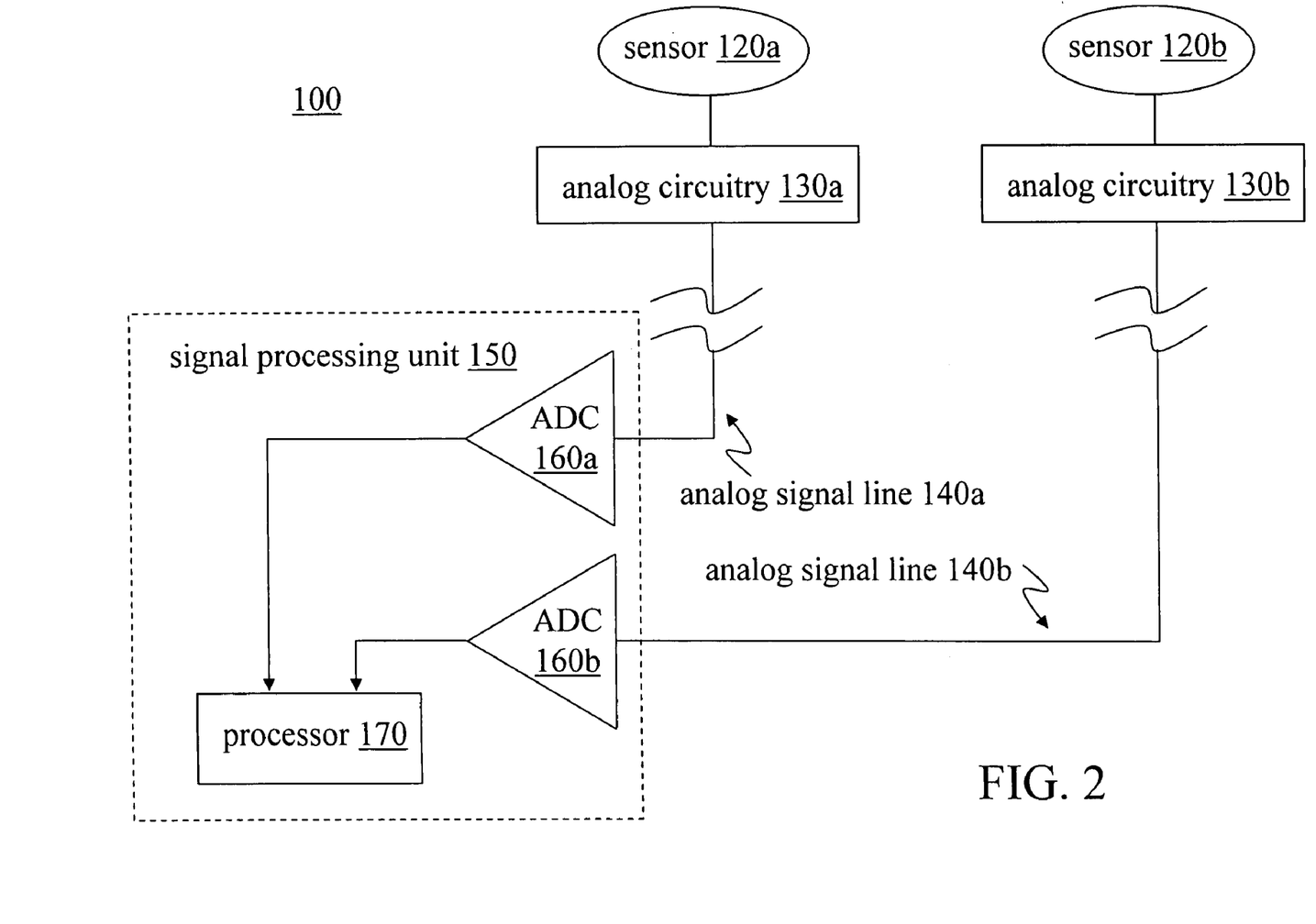
FIG. 2 illustrates an analog sensor network 100.

FIG. 2 shows an example of an analog architecture for a sensor network 100. In this example, the network includes one or more sensors 120, including photosensitive sensors, temperature-sensitive sensors, pressure-sensitive sensors, magnetosensitive sensors, charge-sensitive elements and/or other sensors. These sensors may be active or passive and may include one or more semiconductive elements. In one implementation, network 100 may include sensors 120 having photosensitive semiconductive PN junctions (e.g. photodiodes or phototransistors).

Each sensor 120 may be coupled to corresponding analog circuitry 130 such as one or more amplifiers, filters, impedance-matching elements, bias power supplies, or other components. Signals outputted by the sensors 120 or circuitry 130 may be carried over corresponding analog signal lines 140 to a signal processing unit 150. Each of the analog signal lines 140 may be implemented as a long wire. Signal processing unit 150 may be mounted within an electronics rack or included in a larger system mounted in such a rack that is located remote from he sensors. Signal processing unit 150 may include one or more analog-to-digital converters (ADCs) 160, each of which receives a signal over a corresponding analog input line 140.

Analog signals received from sensors 120 or circuitry 130 and converted to digital signals by ADCs 160 may then be processed, stored, and/or transmitted (e.g. to another processor) by processor 170. Processor 170 may be implemented as one or more microprocessors, DSP units, FPGAs or similar programmable devices, or other arrays of logic elements. In one application, processor 170 may be implemented as an embedded microcontroller. Signal processing unit 150 may also output control signals, e.g., to control multiplexing of analog signals onto analog signal line 140.

A sensor network having an analog architecture may be limited in terms of the signal-to-noise ratio (SNR) and dynamic range of the measurement values as received by signal processing unit 150. Such a network may have other disadvantages in particular environments. In high-vacuum applications, for example, it may be desirable to minimize the total length in vacuum of the sensor signal lines due to outgassing of the cable insulation from analog signal lines 140, among other problems. Thus, the length of standard analog signal lines 140 may be disadvantageously long for use in high-vacuum environments. One exemplary environment is an exposure area of a machine for EUV lithography, in which sensors may be deployed to measure such parameters as temperature, dose, and intensity, among other parameters, with the measured values typically being transmitted to a processing unit outside a vacuum area.

Figure 3:
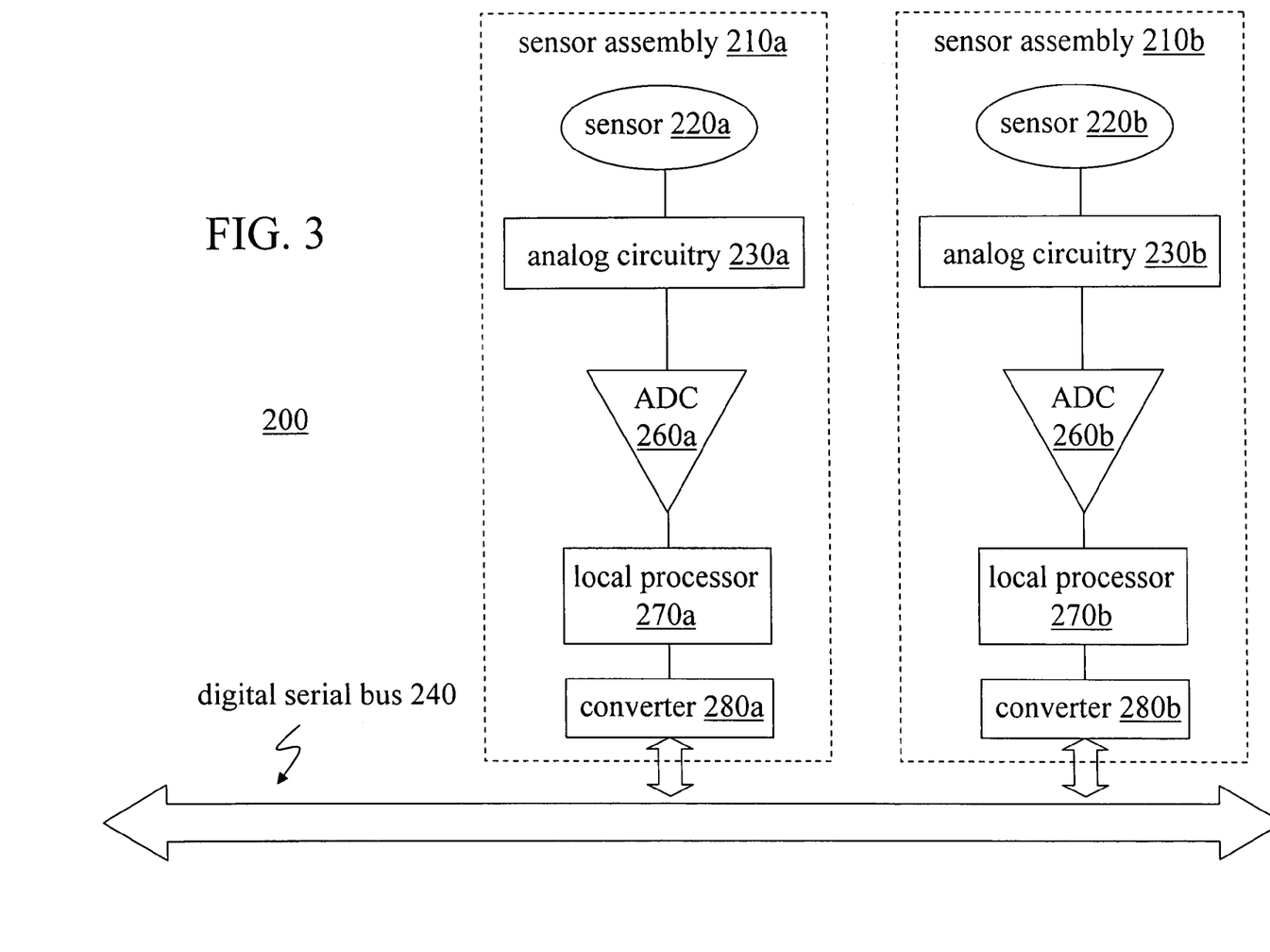
FIG. 3 illustrates a sensor network 200 according to an embodiment of the invention.

FIG. 3 shows an example of a digital architecture for a sensor network 200 according to an embodiment of the invention. Each sensor assembly 210 may include at least one sensor 220, including photosensitive sensors, temperature-sensitive sensors, pressure-sensitive sensors, magnetosensitive sensors, charge-sensitive elements, and/or other sensors. The sensors may be active or passive and may include one or more semiconductive elements. Sensors 220 may be the same as sensors 120 used in an analog network 110, or they may be different, for example, to suit the particular implementation of other elements of the sensor assembly 210. The sensors may be configured to measure pressure, acceleration, presence of objects, and other measurements.

In one implementation, network 200 may include one or more sensors 220 that have photosensitive semiconductive PN junctions, including photodiodes or phototransistors. Although FIG. 3 shows two sensor assemblies 210, it will be understood that a network 200 may include an arbitrary number of such assemblies, with the assemblies possibly including sensors 220 of different types. Sensor assemblies 210 may be coupled to a digital serial bus 240. In an alternative embodiment, sensor assemblies 210 may be coupled to a plurality of digital serial buses.

Each sensor assembly 210 also may include analog circuitry 230 such as one or more amplifiers, filters, impedance-matching elements, bias power supplies, and other components. In one embodiment of the invention, analog circuitry 230 may be the same as circuitry 130 used in an analog network 100. In an alternative embodiment of the invention, analog circuitry 230 may differ from circuitry 130 to suit particular implementations of other elements of the sensor assembly 210, including sensitivity to noise, interference, and/or temperature, among other conditions, and/or particular constraints of the environment including, and risk of contamination, among other constraints.

Each sensor assembly 210 also may include an ADC 260, which converts the analog signal from corresponding analog circuitry 230 into a digital signal, and a local processor 270 that receives the digital signal from the ADC 260. Local processor 270 may be implemented as a microprocessor, microcontroller, DSP unit, FPGA or other programmable device, or another array of logic elements. Local processor 270 also may include storage that may be implemented as semiconductor memory, such as SRAM, DRAM, FLASH, among other memory, and may in some cases be implemented on the same chip as local processor 270. Such storage may be used to store information such as measurement data, configuration data and/or other operational parameters that may be based, for example, on packets received over digital serial bus 240.

In one embodiment of the invention, converter 280 may be a serial-to-parallel converter that receives the digital signal from local processor 270 in parallel form, converts the signal to serial form, and transmits the signal over digital serial bus 240. In another embodiment of the invention, the signal may be an electrical signal having an electric potential that varies over time with respect to a reference potential. In an alternative embodiment, serial-to-parallel converter may be configured to transmit a digital signal through a wireless medium, optical medium, fiber optic medium or other communication medium.

In one embodiment of the invention, serial-to-parallel converter 280 may receive signals (e.g. packets) from digital serial bus 240, convert the signal to parallel form, and transmit the signal to local processor 270. In yet another embodiment, serial-parallel converter 280 may be implemented using a universal asynchronous receiver-transmitter (UART), which may include one or more buffers and/or other elements as known in the art. In some implementations of a sensor assembly 210, local processor 270 and converter 280 may be integrated into the same array of logic elements. In a sensor assembly 210, one or more of ADC 260, local processor 270, and converter 280 may be implemented on the same chip or in the same chip package. Other configurations may be used.

Figure 4:
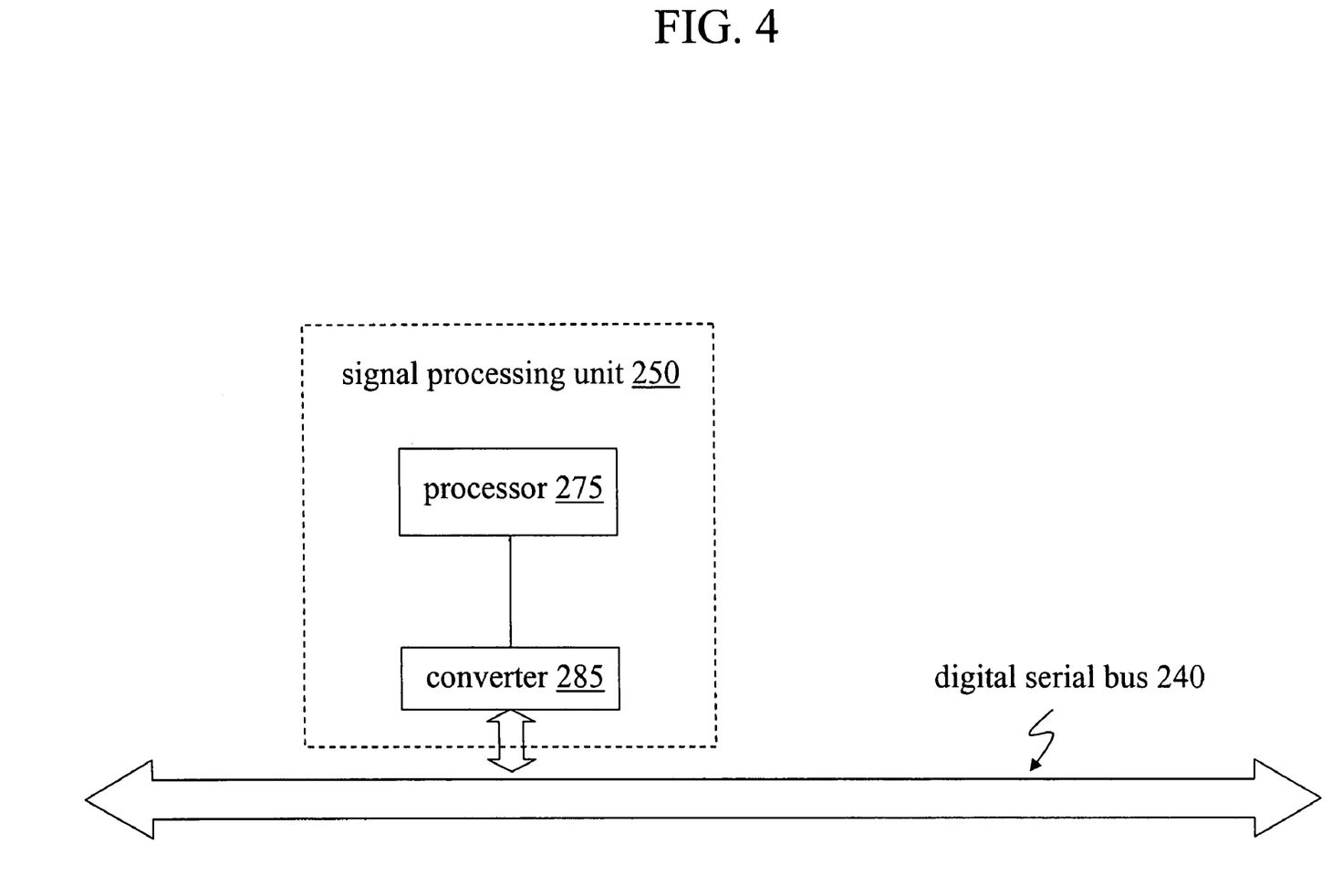
FIG. 4 illustrates another part of a sensor network 200.

FIG. 4 illustrates a signal processing unit 250 that may be connected to digital serial bus 240. Signal processing unit 250 may control sensor assemblies 210 and process data measured by the sensor assemblies 210. Processor 275 may be implemented as a microprocessor, microcontroller, DSP unit, FPGA or other programmable device, or another array of logic elements. Processor 275 may communicate with a memory, such as a semiconductor RAM or other memory; a storage device, such as a hard disk or other storage device; or other devices over a network, including wired, wireless, optical and/or other networks. In addition to communicating with the sensor assemblies 210, processor 275 may perform other operations including processing data and/or controlling other systems and/or may communicate with other devices over digital serial bus 240.

The elements of signal processing unit 250 may be mounted together in a rack, but these elements need not be in the same enclosure or on the same card. In one embodiment of the invention, signal processing unit 250 may be positioned at some distance from at least some of the sensors to be located remote from the environment being sensed. In a vacuum environment, for example, it may be desirable for unit 250 to be located outside the vacuum area. In another embodiment of the invention, network 200 may include sensors or sensor assemblies local to signal processing unit 250 in order to monitor ambient temperature or other control conditions relative to the environment being sensed.

By placing an intelligent ADC, such as an ADC and digital processing logic at each sensor, the signals may be digitized as close as possible to the measurement location. In alternative embodiments, two or more ADCs may be placed at each sensor. Such proximity of conversion may enable a higher dynamic range and SNR. It may be desirable for the design of the digital interface to allow a flexible number of sensor assemblies 210 to be coupled to one bus 240 through a multi-drop cables or other coupling device.

In an exemplary embodiment, two or more ADCs may be configured to operate in parallel to enhance processing. For example, a sensor 220 may perform a first measurement just before a light pulse is generated by the lithographic apparatus (e.g., a dark measurement) and may perform a second measurement shortly after the light pulse is generated by the lithographic apparatus. The ADC 260 may be configured to subtract the first measurement from the second measurement. If the amount of time that passes between the first measurement and the second measurement is less than the conversion time of a single ADC 260, two or more ADCs 260 may be used in an alternating fashion to avoid missing measurements. Other configurations may be used.

Due to vacuum constraints, such as no air being present to support conductive heat transfer, the allowable power dissipation in the vacuum area for the sensor assemblies 210 and/or parts thereof, including local processor 270, may be limited. Low-power operation may have advantages in other situations as well. For applications in which dimensional variation is to be avoided, for example, it may be desirable to minimize local heating. Thus, low-power operation of the sensor assemblies 210 may be advantageous in lithography even at atmospheric pressures to minimize local heating of, for example, a spot sensor in a wafer stage of a lithographic apparatus or other locations.

Placing a limit on power dissipation may also limit the maximum allowable baud rate because higher baud rates typically increase power dissipation through higher switching frequencies. The reduced baud rate may limit the number of sensor values that may be transferred across digital serial bus 240 between two adjacent sensing events (e.g. laser pulses used to expose a pattern such as a circuit design onto a sensitive substrate). In a current implementation, special low-power electronics may be used to support baud rates up to 2.4 Mbit/sec. In alternative embodiments, higher or lower baud rates may be used.

In one embodiment of the invention, the baud rate may be maximized using timeslots. Timeslots may be defined based on periods of time that data is expected to be received from the selected sensor assemblies 210. In one embodiment, timeslots may be defined based on cycles and a may include a passage of time within the cycles. In an exemplary embodiment, timeslots may be defined by the cycle in which the slave device 504 may perform actions such as, triggering and/or taking a measurement; the cycle in which the slave device 504 may respond; a delay during the cycle in which the slave device 504 may answer; and other timing information. An implementation of timeslots will be explained in more detail with reference to FIG. 9.

In a further embodiment of the invention, sensor assembly 210 may be provided with advance notification regarding when to perform measurements and when to provide the measurement values to processor 275, or other receiving device. Such advance scheduling of data transmission may facilitate real-time operation of network 200 and reduce overhead that may otherwise arise from access negotiation and/or data collisions.

Potential advantages of an implementation of digital network 200 as compared to analog network 100 include improved measurements for dynamic range and/or signal-to-noise ratio, reduced total cable lengths, which in turn may reduce corresponding levels of outgassing in a vacuum environment, and lower power consumption by enabling hibernation of components, among other advantages. The digital configuration may also offer increased flexibility as compared to an analog solution. For example, operational parameters of sensor assemblies 210, such as sensor configurations including measurement range, selection from among more than one local sensor, and/or timing of measurements may be modified using software. Additionally, in some implementations, sensed data may be processed within a sensor assembly 210, thereby potentially reducing the amount of data to be transferred over the bus 240. Additional advantages of processing data within sensor assemblies include enabling integration of multiple measurements. The invention provides other advantages.

In one embodiment of the invention, the sensor assemblies 210 may correspond to slave devices and their associated remote processing unit 250 may correspond to a master device. In an alternative embodiment of the invention, a plurality of master devices may be associated with a plurality of slave devices, wherein one or more master devices may actively communicate with the plurality of slave devices. In a configuration that permits one "active" master, the "active" master may be dynamically assigned from among the plurality of master devices.

In order to minimize power dissipation by the sensor assemblies 210, it may be desirable to reduce the number of bits that are transferred between the slave devices and the master devices. In conducting communications across digital serial bus 240, it may be desirable to use a protocol that has been optimized for low overhead. A half-duplex bus suitable for real-time data acquisition is described herein. Other configurations, such as a full duplex bus also may be used.

In one embodiment of the invention, an overhead of address packets may be reduced by using twelve-bit packets that include an address bit. The address bit further enables power savings by allowing the slaves to hibernate until accessed. In another embodiment of the invention, this real-time sensor bus protocol may be implemented to provide a low-power, reliable multi-drop serial bus for communication with digital sensors within the vacuum environment of one or more EUV machines. In alternative embodiments, the real-time sensor bus protocol may be applied to other sensing applications.

Figure 5:
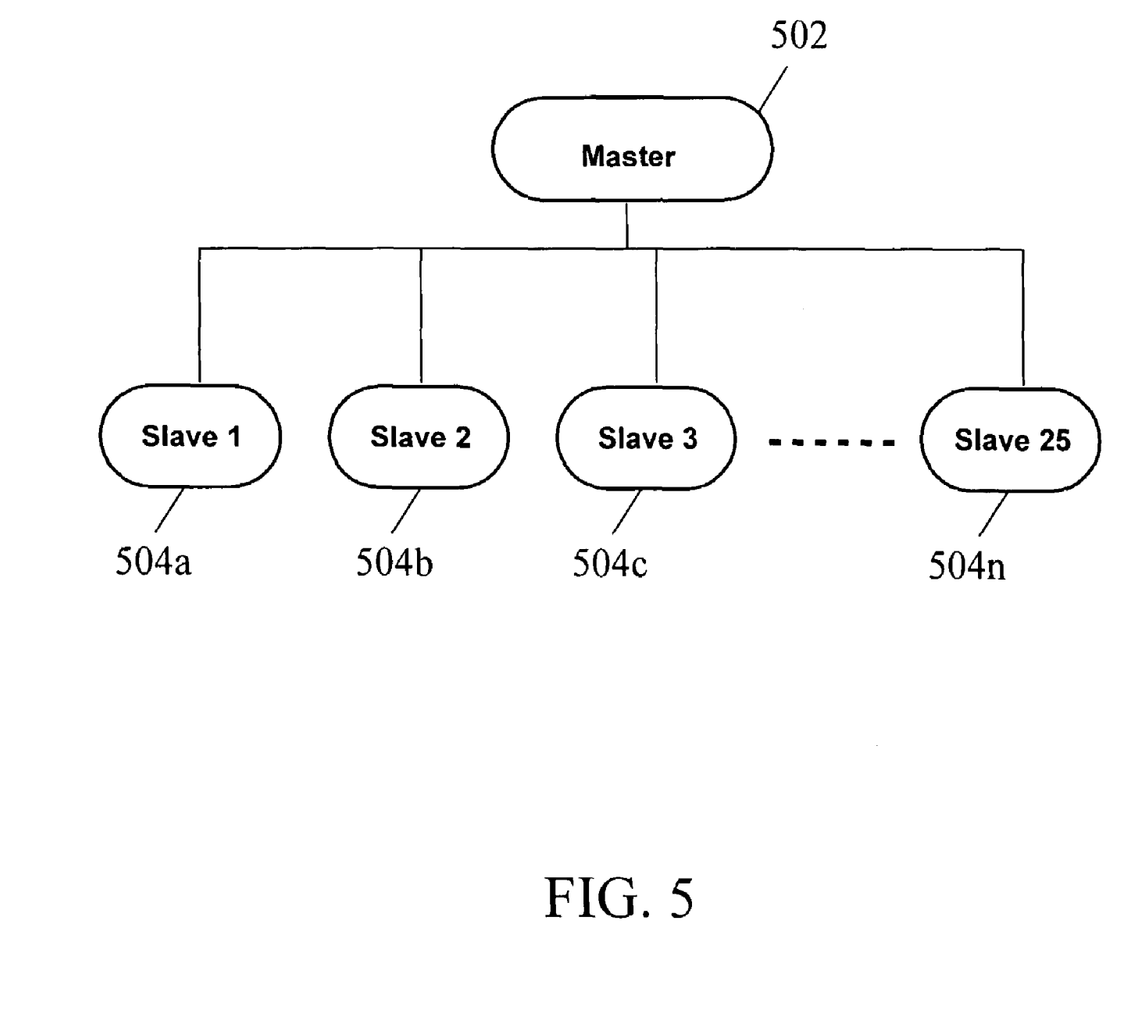
FIG. 5 illustrates a context diagram of a digital network according to an embodiment of the invention.

FIG. 5 illustrates a context diagram of digital network 200 that may be implemented using a protocol according to one embodiment of the invention. In this example, master device 502 may correspond to signal processing unit 250 and may communicate with up to 25 slaves devices, which correspond to sensor assemblies 210. Other configurations or number of devices may be used.

The real time sensor bus protocol may be structured into frames that include an address, data blocks, and extra information bytes, such as length and checksum, among other information. In this protocol, which is developed according to the OSI model, the master device 502 may control all data traffic using the digital serial bus 240.

In one embodiment of the invention, two kinds of communication modes may be implemented: one-on-one mode (master-slave-master) and broadcast mode (master-slaves-master). Four types of frames may be created for the two kinds of communication modes, including one-on-one master frames, one-on-one slave frames, broadcast master frames, and broadcast slave frames.

Figure 6:
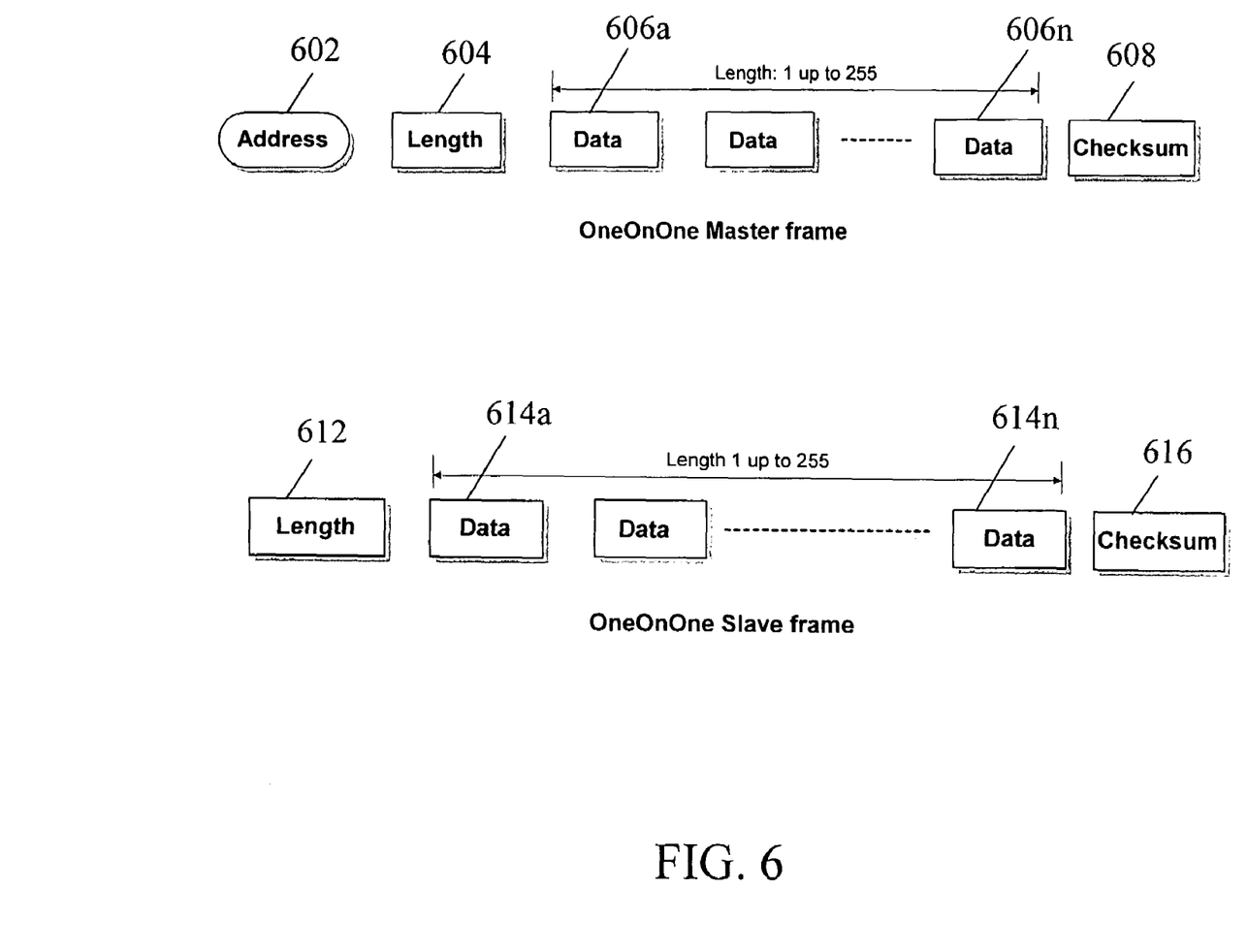
FIG. 6 illustrates an example of data transferred in a one-on-one mode.

FIG. 6 illustrates an example of data frames transferred in one-on-one mode for a corresponding one-on-one master frame and a corresponding one-on-one slave frame. In one embodiment of the invention, the one-on-one master frame may include one address byte 602, a length byte 604, one or more data bytes 606 (606a-606n) and a checksum byte 608. Address byte 602 may include the address for the slave that is selected to receive the information. In another embodiment of the invention, the one-on-one slave frame may include a length byte 612, one or more data bytes 614 (614a-614n) and a checksum byte 616.

One-on-one mode is a direct way for the master device 502 to communicate with the slave devices 504. In one embodiment of the invention, the master device 502 may send a one-on-one master frame to all the slave devices 504 that includes a request or command for a selected slave device 504. Optionally, the one-on-one master frame may include data for the selected slave device 504. Slaves devices 504 that are not selected to receive the one-on-one master frame are configured to ignore the frame. In an exemplary embodiment, one-on-one commands may be used during an initialization phase to set up the digital serial bus 240 and the slave devices.

In another embodiment, the selected slave device 504 may be configured to respond with a one-on-one slave frame, thus acknowledging the command from the master device 502 and optionally including data requested by the master device 504. The selected slave device 504 may provide configuration data that includes a temperature of the microcontroller at the slave device, a random number, a software version identification, all previous data, test output, an upload of sensor firmware, and other configuration data. Alternatively, the selected slave device 504 may provide data measured by the selected slave device 504 for conditions that are remote to the slave device 504. Non-selected slave devices 504 may be configured to ignore the one-on-one slave frame sent by the selected slave device 504.

Figure 7:
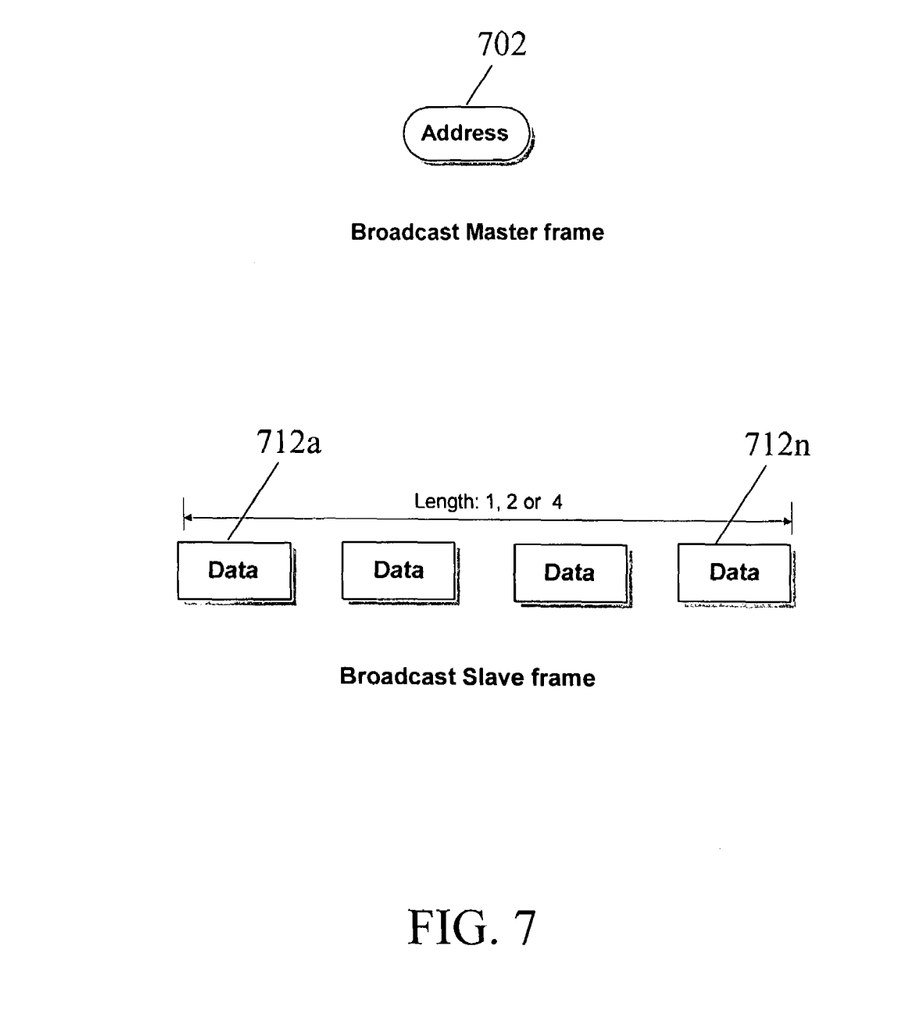
FIG. 7 illustrates an example of data transferred in a broadcast mode.

FIG. 7 illustrates an example of data frames transferred in broadcast mode for a corresponding broadcast master frame and a corresponding broadcast slave frame. In one embodiment of the invention, broadcast master frame may include one address byte 702. Broadcast slave frame may include one, two, or four data bytes, as decided by master device 502. In one embodiment of the invention the broadcast mode may be implemented during system operation.

In broadcast mode, the master device 502 may simultaneously send one broadcast master frame to all slave devices 504. In one embodiment of the invention, slave devices 504 may be configured not to acknowledge receiving the broadcast master frame. In another embodiment, selected slave devices 504 may respond to the master device 502 with a broadcast slave frame in a corresponding predefined time interval, which may be set by the master device 502, thus allowing operation in real time. Before sending a broadcast command, the master device 502 may provide all slave devices 504 with timing information including in which cycle the slave device 504 may perform an action such as, triggering and/or taking a measurement; in which cycle the slave device 504 may respond; at which time during the cycle the slave device 504 may answer; and other timing information. The timing information is hereinafter referred to as a timeslot. The timeslot may be provided to the slave devices 504 through the one-on-one master frames.

Additionally, the master device 502 may provide information to the slave device 504 including how many data packets are available for response. For example, selected slave devices 504 may be instructed to each send a response in one, two, or four packets. In other implementations, selected slave devices 504 may respond with three packets, and/or it may be acceptable for selected slave devices 504 to respond with more than four packets.

Figure 8:
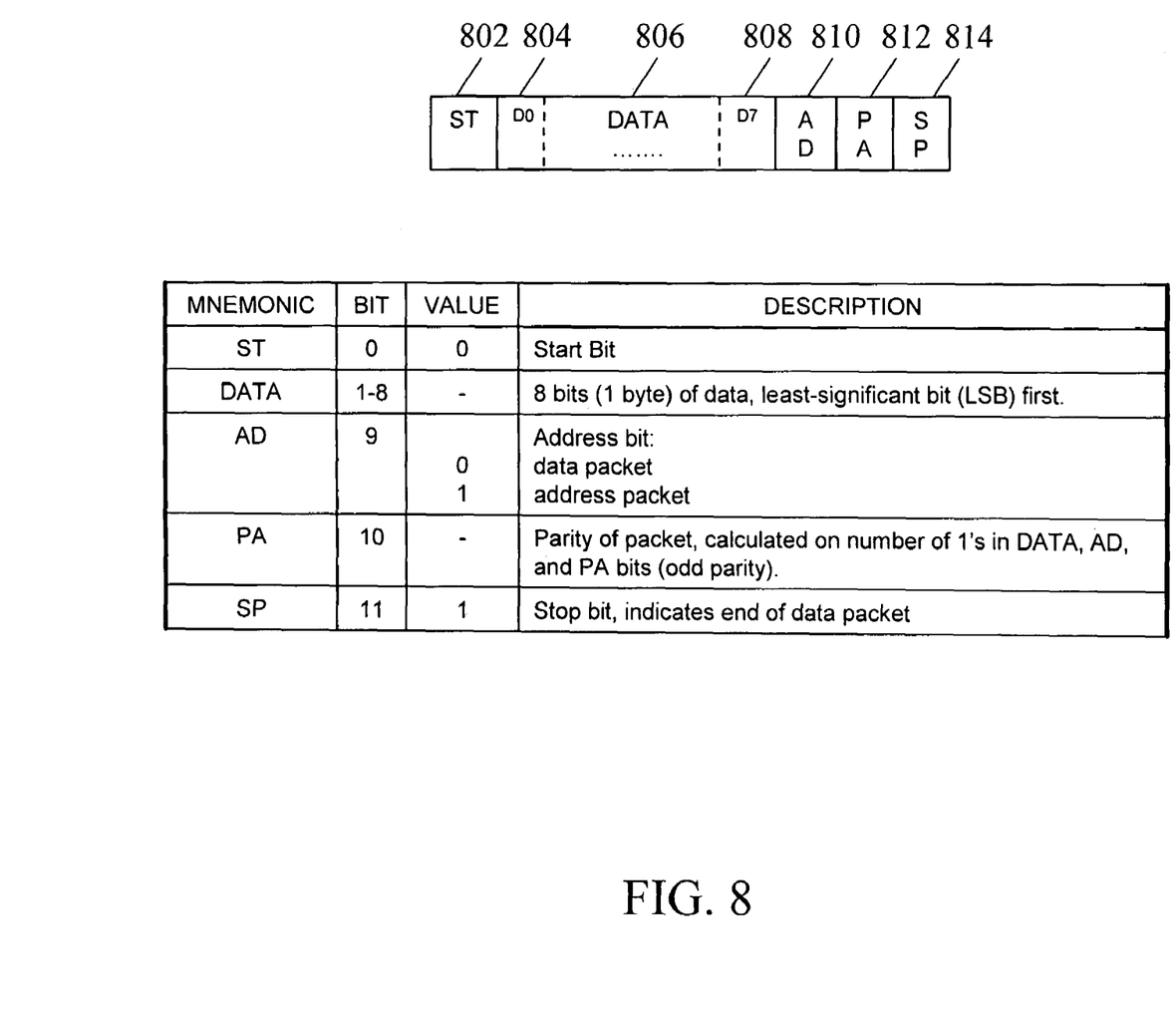
FIG. 8 illustrates the content of a packet conforming to a protocol according to an embodiment of the invention.

FIG. 8 illustrates the content of a packet that may be used to construct frames according to one embodiment of the serial protocol. The packet may include two framing bits (start bit 802 and stop bit 814), an error detection bit 812 (parity), a status bit 810 (indicating whether the data field carries data or an address), and an eight-bit data field 804-808.

Figure 9:
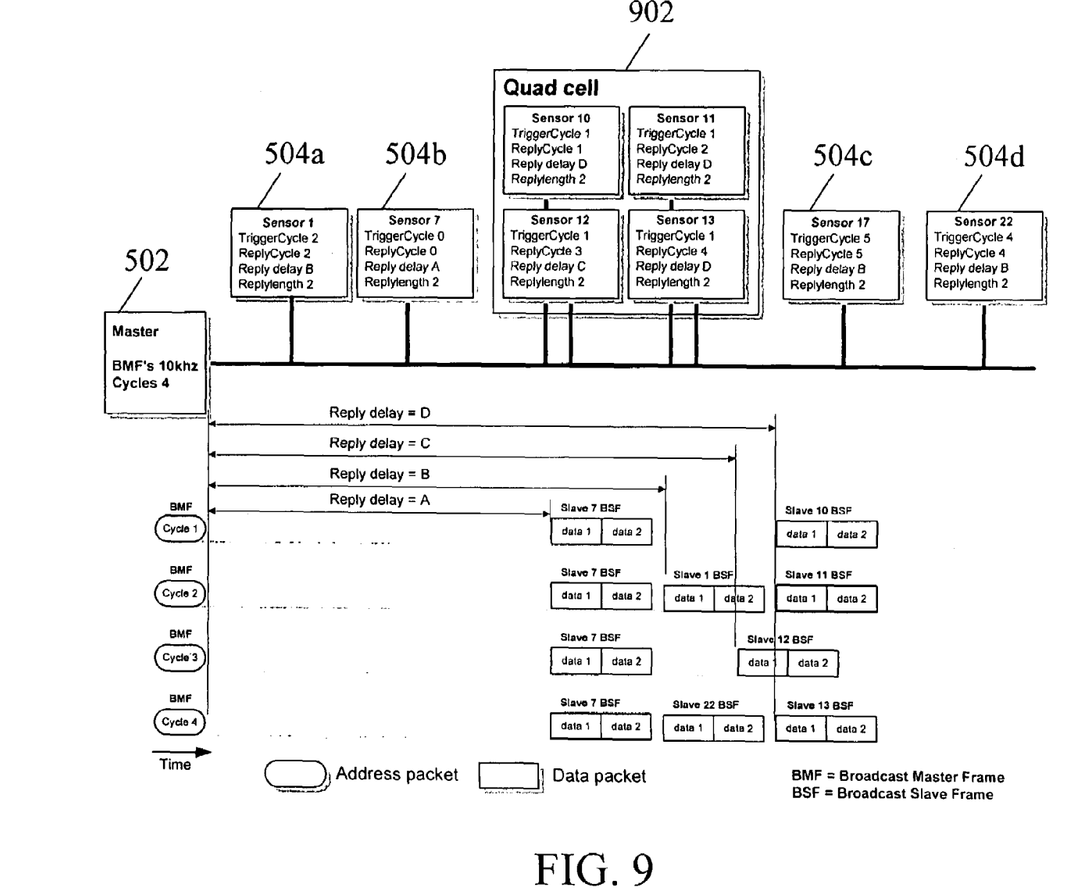
FIG. 9 illustrates another example of data transferred in a broadcast mode.

FIG. 9 illustrates an exemplary embodiment a broadcast mode data transfer. In this example, the master device 502 may initialize all slave devices 504, such that the slave devices 504 may respond differently to various broadcast master frames. In one embodiment of the invention, a broadcast master frame may provide the slave devices 504 with information that identifies a cycle number in which the slave device 504 may perform an action, including measuring data, waiting for a response, performing no actions, among other actions. Additionally, in order to prevent multiple slave devices 504 from responding at a same time, the slave devices 504 use reply delays as a starting indicator to transmit the broadcast slave frames.

Referring to FIG. 9, the configuration of the sensors on the digital serial bus is illustrated. For each slave device, the setting for trigger cycle, reply cycle, reply delay, and reply length are illustrated. Before sending any broadcast master frame, the master device 502 may provide pretrigger commands that include trigger cycle, reply cycle, reply delay, and reply length, addresses, among other parameters, to selected slave devices 504. In one embodiment, eight addresses are reserved and used in the pretrigger commands, wherein each address corresponds to a cycle. Thus, eight cycles may be defined by the master device 502. If one or more of these parameters is not set in the slave devices 504 prior to receiving the broadcast master frame, the slave devices 504 that do not have a complete set of parameters may not respond to the broadcast message.

In the exemplary embodiment, the master device 502 may send a plurality of broadcast master frames and cycle numbers at a predefined frequency. This frequency may correspond to the frequency at which the light source, such as a laser or EUV source may be triggered and emits light. As illustrated in FIG. 9, the master device 502 may send four different broadcast master frames, cycle numbers 1-4 at a frequency of 10 kHz.

Slave device 504a, which corresponds to sensor 1, may be initialized to perform a measurement at cycle 2 and to transmit the measured data at cycle 2 in two packets after a delay B. Slave device 504b, which corresponds to sensor 7, may be initialized to perform a measurement at cycle 0 (i.e. every cycle) and to transmit the measured data at cycle 0 (every cycle) in two packets after a delay A. Quad cell 902 may include four slave devices to measure alignment of the reticle, light source, and/or wafer during a cycle 1 and to transmit the measured data during corresponding ones of cycles 1-4, in two packets after a corresponding delay C or D.

Advantages of embodiments of the invention may include cable length reduction, lower power consumption, and real-time operation, among other advantages. Although embodiments of the invention may be suited for use in vacuum environments, these or other embodiments may also be used in environments under other conditions, such as atmospheric or other pressures. For example, such an architecture may also be deployed in atmospheric-pressure lithography environments. Such a network configuration may also be used for sensors other than those expressly described, such as temperature sensors or other sensors.

Although specific reference may be made herein to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams, among other beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The foregoing presentation of the described embodiments is provided to enable any person skilled in the art to make or use the present invention. Various modifications to these embodiments are possible, and the generic principles presented herein may be applied to other embodiments as well. For example, the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. The specification should be considered exemplary only, and the scope of the invention is accordingly intended to be limited only by following claims.

What is claimed is:

1. A sensor assembly, comprising:
   a sensor configured to output sensor data;
   an analog-to-digital converter configured to receive an analog signal corresponding to the sensor data and to output a digital signal of the sensor data; and
   a local processor that is electrically coupled to the analog-to-digital converter and is configured to receive a first data transmission from a remote processor and to transmit a second data transmission,
   wherein the local processor is configured to transmit the second data transmission based on information received in the first data transmission,
   wherein the first transmission includes an address of a target sensor assembly.

2. The sensor assembly according to claim 1, wherein the first data transmission comprises pretrigger commands and wherein the second data transmission comprises an acknowledgement of receipt of the pretrigger commands.

3. The sensor assembly according to claim 2, wherein the first and second data transmissions includes a data frame and wherein a first data byte of the first data transmission includes the address of the target sensor assembly.

4. The sensor assembly according to claim 2, wherein the local processor transmits the second data transmission based on a timeslot that is defined by the pretrigger commands in the first data transmission.

5. The sensor assembly according to claim 2, wherein the digital signal includes information corresponding to a value of the sensor data measured at a time indicated by the pretrigger commands in the first data transmission.

6. The sensor assembly according to claim 1, wherein the first data transmission comprises an address packet and wherein the second data transmission comprises sensor data.

7. The sensor assembly according to claim 6, said sensor assembly comprising a plurality of sensors,
   wherein the digital signal includes information corresponding to a value of the sensor data received from a selected one of the sensors, and
   wherein said selected one of the sensors is selected based on information received in the first data transmission.

8. The sensor assembly according to claim 1, wherein the sensor data comprises one of measurement data and configuration data.

9. The sensor assembly according to claim 1, wherein the second data transmission is initiated based on the information received in the first data transmission.

10. The sensor assembly according to claim 1, wherein the local processor is coupled to a bus.

11. The sensor assembly according to claim 10, wherein the bus is a digital serial bus.

12. The sensor assembly according to claim 1, wherein the sensor comprises a photosensitive element.

13. The sensor assembly according to claim 1, wherein the sensor assembly is configured to operate in a vacuum.

14. A method of providing data to a remote processor, said method comprising:
   receiving information over a serial data line from the remote processor;
   generating an analog signal corresponding to a condition sensed at a measurement site;
   at a location local to the measurement site, obtaining a digital signal based on the analog signal;
   at the location local to the measurement site, outputting a serial data stream based on the digital signal; and
   transporting information over the serial data line to the remote processor,
   wherein at least one among said generating the analog signal, obtaining the digital signal, and outputting the serial data stream is performed in accordance with the information received over the serial data line,
   wherein receiving information over the serial data line includes receiving an address of a target sensor assembly.

15. The method of claim 14, wherein receiving information over the serial data line includes receiving the information as a first data frame, wherein the serial data stream includes a second data frame, and wherein a first data byte of the first data frame includes the address of the target sensor assembly.

16. The method of claim 14, wherein receiving information over the serial data line includes receiving pretrigger commands in a first data frame and wherein the serial data stream includes an acknowledgement of receipt of the pretrigger commands in a second data frame.

17. The method of claim 16, wherein outputting the serial data stream is based on a timeslot that is defined by pretrigger commands received over the serial data line.

18. The method of claim 16, wherein the digital signal includes information corresponding to a value of the measurement signal measured at a time indicated by the pretrigger commands received over the serial data line.

19. The method of claim 14, wherein outputting the serial data stream is initiated based on the information received over the serial data line.

20. The method of claim 14, said method comprising generating a plurality of analog signals corresponding to conditions sensed at the measurement site,
   wherein the digital signal includes information corresponding to a value of a selected one of the plurality of analog signals, and
   wherein said selected one of the plurality of analog signals is selected based on said information received over the serial data line.

21. The method of data measurement according to claim 14, wherein said generating the analog signal comprises generating the analog signal based on at least one of measuring illumination, temperature, pressure, acceleration, and presence detection of objects.

22. The method of data measurement according to claim 14, wherein said measurement site is located in a vacuum chamber.

23. A method of data acquisition, said method comprising:
   transmitting digital control information to a sensor assembly in a vacuum area over a serial data bus, said digital control information including an address of the sensor assembly; and based on the control information, receiving a serial data stream over the serial data bus, said serial data stream including digital sensor data from the sensor assembly.

24. The method of data acquisition according to claim 23, wherein said transmitting digital control information includes transmitting a first data frame including said digital control information having pretrigger commands, wherein said serial data stream includes a second data frame including said digital sensor data, and wherein a first data byte of the first data frame includes the address of the sensor assembly.

25. The method of data acquisition according to claim 24, wherein the serial data stream is transmitted based on a timeslot that is defined by the pretrigger commands.

26. The method of data acquisition according to claim 24, wherein the serial data stream includes information corresponding to a value of sensor data measured at a time indicated by the pretrigger commands in said digital control information.

27. The method of data acquisition according to claim 23, wherein said transmitting digital control information includes a first data frame comprising an address packet and wherein said serial data stream includes a second data frame comprising said digital sensor data.

28. The method of data acquisition according to claim 23, wherein the sensor data comprises one of measurement data configuration data.

29. The method of data acquisition according to claim 23, wherein said serial data stream is transmitted at a time designated by the digital control information.

30. The method of data acquisition according to claim 23, wherein said serial data stream includes digital sensor data from a selected one of a plurality of sensor assemblies, and wherein the selected one of a plurality of sensor assemblies is selected based on the digital control information.

31. The method of data acquisition according to claim 23, wherein the digital sensor data comprises at least one of illumination, temperature, pressure, acceleration, and presence detection of objects.

* * * * *